United States Patent
Step et al.

(10) Patent No.: US 7,175,946 B2
(45) Date of Patent: Feb. 13, 2007

(54) MODIFIED PIGMENT PRODUCTS AND BLACK MATRIXES COMPRISING SAME

(75) Inventors: Eugene N. Step, Newton, MA (US); James A. Belmont, Acton, MA (US)

(73) Assignee: Cabot Corporation, Boston, MA (US)

( * ) Notice: Subject to any disclaimer, the term of this patent is extended or adjusted under 35 U.S.C. 154(b) by 215 days.

(21) Appl. No.: 10/337,761

(22) Filed: Jan. 7, 2003

(65) Prior Publication Data

US 2003/0129529 A1    Jul. 10, 2003

Related U.S. Application Data

(60) Provisional application No. 60/346,306, filed on Jan. 7, 2002, provisional application No. 60/408,414, filed on Sep. 5, 2002.

(51) Int. Cl.
*G03F 7/004* (2006.01)
*G02B 5/20* (2006.01)

(52) U.S. Cl. .................. 430/7; 430/18; 430/270.1; 430/281.1

(58) Field of Classification Search .............. 430/7, 430/270.1, 281.1
See application file for complete search history.

(56) References Cited

U.S. PATENT DOCUMENTS

| | | | |
|---|---|---|---|
| 3,479,300 A | 11/1969 | Rivin et al. ............... 252/430 |
| 4,014,844 A | 3/1977 | Vidal et al. ............ 260/31.2 R |
| 4,946,509 A | 8/1990 | Schwartz et al. ............ 106/496 |
| 5,281,261 A | 1/1994 | Lin et al. .................. 106/20 R |
| 5,418,277 A | 5/1995 | Ma et al. .................... 524/520 |
| 5,545,504 A | 8/1996 | Keoshkerian et al. ........ 430/137 |
| 5,698,016 A | 12/1997 | Adams et al. ............... 103/316 |
| 5,714,993 A | 2/1998 | Keoshkerian et al. ......... 347/95 |
| 5,895,522 A | 4/1999 | Belmont et al. ............ 106/31.6 |
| 5,914,806 A | 6/1999 | Gordon II et al. .......... 359/296 |
| 5,952,429 A * | 9/1999 | Ikeda et al. ............... 525/326.1 |
| 5,964,935 A | 10/1999 | Chen et al. .................. 106/401 |
| 5,968,243 A | 10/1999 | Belmont et al. ......... 106/31.65 |
| 6,068,688 A | 5/2000 | Whitehouse et al. ..... 106/31.65 |
| 6,103,380 A | 8/2000 | Devonport ................... 428/403 |
| 6,110,994 A | 8/2000 | Cooke et al. ................ 523/215 |
| 6,150,433 A | 11/2000 | Tsang et al. ................. 523/160 |
| 6,221,932 B1 | 4/2001 | Moffatt et al. .............. 523/160 |
| 6,235,829 B1 | 5/2001 | Kwan .......................... 524/495 |
| 6,336,965 B1 | 1/2002 | Johnson et al. ............. 106/31.6 |
| 6,350,519 B1 | 2/2002 | Devonport ................... 428/403 |
| 6,372,820 B1 | 4/2002 | Devonport ................... 523/215 |
| 6,398,858 B1 | 6/2002 | Yu et al. ................... 106/31.64 |
| 6,402,825 B1 | 6/2002 | Sun ............................. 106/473 |
| 6,432,194 B2 | 8/2002 | Johnson et al. ............. 106/499 |
| 6,458,458 B1 | 10/2002 | Cooke et al. ................ 428/407 |
| 6,472,471 B2 | 10/2002 | Cooke et al. ................ 525/165 |
| 6,478,863 B2 | 11/2002 | Johnson et al. ............. 106/31.6 |
| 6,494,943 B1 | 12/2002 | Yu et al. ................... 106/31.65 |
| 6,506,245 B1 | 1/2003 | Kinney et al. .............. 106/493 |
| 6,602,335 B2 | 8/2003 | Moffatt et al. ............. 106/31.8 |
| 6,641,656 B2 | 11/2003 | Yu et al. ...................... 106/493 |
| 6,664,312 B2 | 12/2003 | Devonport ................... 523/205 |
| 6,699,319 B2 | 3/2004 | Adams et al. ............... 106/476 |
| 6,723,783 B2 | 4/2004 | Palumbo et al. ............ 524/555 |
| 6,833,026 B2 | 12/2004 | Palumbo ..................... 106/473 |
| 6,911,073 B2 | 6/2005 | Adams et al. ............... 106/476 |
| 6,916,367 B2 | 7/2005 | Palumbo ..................... 106/473 |
| 2001/0003263 A1 | 6/2001 | Johnson et al. ............. 106/413 |
| 2001/0036994 A1 | 11/2001 | Bergemann et al. ........ 524/495 |
| 2002/0011185 A1* | 1/2002 | Belmont ..................... 106/410 |
| 2002/0147252 A1 | 10/2002 | Adams ........................ 523/161 |
| 2003/0195291 A1 | 10/2003 | Lamprey et al. ............ 524/495 |
| 2004/0007161 A1 | 1/2004 | Belmont et al. ............. 106/499 |

FOREIGN PATENT DOCUMENTS

| | | |
|---|---|---|
| EP | 0 677 556 A2 | 10/1995 |
| EP | 0 987 303 A * | 3/2000 |
| WO | WO01/25340 | 4/2001 |

* cited by examiner

*Primary Examiner*—John A. McPherson

(57) ABSTRACT

The present invention describes modified pigment products comprising a pigment having attached at least one photopolymerizable group and at least one ionic or ionizable group. Dispersions, black matrixes, and resin compositions comprising these modified pigment products are also disclosed.

35 Claims, No Drawings

MODIFIED PIGMENT PRODUCTS AND BLACK MATRIXES COMPRISING SAME

This application claims priority to U.S. Provisional Patent Application Ser. No. 60/346,306, filed on Jan. 7, 2002, and to U.S. Provisional Patent Application Ser. No. 60/408,414, filed on Sep. 5, 2002.

BACKGROUND OF THE INVENTION

1. Field of the Invention

The present invention relates to modified pigment products and dispersions, black matrixes, and resin compositions comprising these modified pigment products.

2. Description of the Related Art

Black matrix is a generic name for materials used in color displays to improve the contrast of an image by separating individual color pixels. In liquid crystal displays (LCDs), the black matrix is a thin film having high light-shielding capability and is formed between the three color elements of a color filter. In LCD's using thin film transistors (TFT), the black matrix also prevents the formation of photo-induced currents due to reflected light in the TFT.

Conventionally the black matrix layer in liquid crystal displays is manufactured by vapor deposition of Cr/CrO. Although chromium based films have excellent light-shielding capabilities, the metal vapor deposition process is expensive. In addition, chromium use and disposal is subject to increasingly restrictive environmental regulations. Chromium films also have low resistivity, which restricts the electrical design of LCDs to a subset of the possible design configurations.

Black pigments such as carbon black have been used in polymer compositions to make resistive black matrixes. However, typical systems have not been able to provide the desired balance of overall properties. For example, while a black matrix containing a carbon black pigment could provide the required light-shielding capabilities (that is, an optical density (OD) of greater than 3 at 1 micron thickness), typically the film would have only a modest resistivity. Alternatively, if a highly resistive film were produced, the OD was typically low.

Modified pigments having attached organic groups have also been disclosed for use in a black matrix for color filters. While these materials provide black matrixes and dispersions with good overall performance, there remains a need for black matrixes with improved properties, in particular, resistivity and optical density.

SUMMARY OF THE INVENTION

The present invention relates to a modified pigment product comprising a pigment having attached at least one polymeric group. In one embodiment, the polymeric group comprises at least one photopolymerizable group and at least one ionic or ionizable group. In another embodiment, the polymeric group has the formula —X-Sp-[PP], wherein X, which is directly attached to the pigment, represents an arylene, a heteroarylene, or an alkylene group and Sp represents a spacer group. The group PP represents a polymer comprising at least one photopolymerizable group and at least one acidic group. The modified pigments may also be in a liquid vehicle to form a dispersion.

The present invention further relates to a modified pigment product comprising a pigment having attached at least one polymeric group, wherein the pigment is carbon black having a dibutylphthalate adsorption (DBP) of about 25 to 70 mL/100 g. The modified pigment may also be in a liquid vehicle to form a dispersion.

The present invention further relates to a black matrix formed by applying a photosensitive layer onto a substrate, irradiating the photosensitive layer imagewise, and developing and drying the coating. The photosensitive layer comprises a modified black pigment product as described above.

The present invention further relates to a resin composition comprising: a) a photosensitive resin and b) a modified pigment product as described above.

It is to be understood that both the foregoing general description and the following detailed description are exemplary and explanatory only and are intended to provide further explanation of the present invention, as claimed.

DETAILED DESCRIPTION OF THE INVENTION

The present invention relates to modified pigment products, and black matrixes, dispersions, and resin compositions comprising the modified pigment products.

The modified pigment product of the present invention comprises a pigment having attached at least one polymeric group. The pigment can be any type of pigment, such as a black pigment and other colored pigments. Preferably the pigment is a carbon product, such as carbon black. Mixtures of different pigments can also be used. These pigments can also be used in combination with a variety of different types of dispersants in order to form stable dispersions.

Representative examples of black pigments include various carbon blacks (Pigment Black 7) such as channel blacks, furnace blacks and lamp blacks, and include, for example, carbon blacks sold under the Regal®, Black Pearls®, Elftex®, Monarch®, Mogul®, and Vulcan® trademarks available from Cabot Corporation (such as Black Pearls® 2000, Black Pearls® 1400, Black Pearls® 1300, Black Pearls® 1100, Black Pearls® 1000, Black Pearls® 900, Black Pearls® 880, Black Pearls® 800, Black Pearls® 700, Black Pearls® L, Elftex® 8, Monarch® 1400, Monarch® 1300, Monarch® 1100, Monarch® 1000, Monarch® 900, Monarch® 880, Monarch® 800, Monarch® 700, Mogul® L, Regal® 330, Regal® 400, Vulcan® P). Other suitable carbon blacks include, but are not limited to, Printex 40, Printex 80, Printex 300, Printex L, Printex U, Printex V, Special Black 4, Special Black 5, Special Black 250, FW200, (the foregoing available from Degussa Corporation), Raven 780, Raven 890, Raven 1020, Raven 1040, Raven 1255, Raven 1500, Raven 5000, Raven 5250 (the foregoing available from Colombian Chemical Corporation) and MA100 and MA440 available from Mitsubishi Chemical Corporation.

The pigment may also be chosen from a wide range of conventional colored pigments. The colored pigment can be blue, black, brown, cyan, green, white, violet, magenta, red, orange, yellow, as well as mixtures thereof. Suitable classes of colored pigments include, for example, anthraquinones, phthalocyanine blues, phthalocyanine greens, diazos, monoazos, pyranthrones, perylenes, heterocyclic yellows, quinacridones, and (thio)indigoids. Representative examples of phthalocyanine blues include copper phthalocyanine blue and derivatives thereof (Pigment Blue 15). Representative examples of quinacridones include Pigment Orange 48, Pigment Orange 49, Pigment Red 122, Pigment Red 192, Pigment Red 202, Pigment Red 206, Pigment Red 207, Pigment Red 209, Pigment Violet 19 and Pigment Violet 42. Representative examples of anthraquinones include Pigment Red 43, Pigment Red 194 (Perinone Red), Pigment Red 216 (Brominated Pyranthrone Red) and Pigment Red 226 (Pyranthrone Red). Representative examples of perylenes include Pigment Red 123 (Vermillion), Pigment Red 149 (Scarlet), Pigment Red 179 (Maroon), Pigment Red 190 (Red), Pigment Violet 19, Pigment Red 189 (Yellow Shade Red) and Pigment Red 224. Representative examples of thioindigoids include Pigment Red 86, Pigment Red 87, Pigment Red 88, Pigment Red 181, Pigment Red 198, Pigment Violet 36, and Pigment Violet 38. Representative examples of heterocyclic yellows include Pigment Yellow 1, Pigment Yellow 3, Pigment Yellow 12, Pigment Yellow 13, Pigment Yellow 14, Pigment Yellow 17, Pigment Yellow 65, Pigment Yellow 73, Pigment Yellow 74, Pigment Yellow 151, Pigment Yellow 117, Pigment Yellow 128 and Pigment Yellow 138. Such pigments are commercially available in either powder or press cake form from a number of sources including, BASF Corporation, Engelhard Corporation and Sun Chemical Corporation. Examples of other suitable colored pigments are described in the Colour Index, 3rd edition (The Society of Dyers and Colourists, 1982).

Other examples of pigments include Hostafine® series such as Hostafine® Yellow GR (Pigment 13), Hostafine® Yellow (Pigment 83), Hostafine® Red FRLL (Pigment Red 9), Hostafine® Rubine F6B (Pigment 184 ), Hostafine® Blue 2G (Pigment Blue 15:3), Hostafine® Black T (Pigment Black 7), and Hostafine® Black TS (Pigment Black 7), Normandy Magenta RD-2400, Paliogen Violet 5100, Paliogen® Violet 5890, Permanent Violet VT2645, Heliogen Green L8730, Argyle Green XP-111-S, Brilliant Green Toner GR 0991, Heliogen® Blue L6900, L7020, Heliogen® Blue D6840, D7080, Sudan Blue OS, PV Fast Blue B2GO1, Irgalite Blue BCA, Paliogen® Blue 6470, Sudan III, Sudan II, Sudan IV, Sudan Orange G, Sudan Orange 220, Paliogen® Orange 3040, Ortho Orange OR 2673, Paliogen® Yellow 152, 1560, Lithol Fast Yellow 0991K, Paliotol Yellow 1840, Novoperm® Yellow FG 1, Permanent Yellow YE 0305, Lumogen Yellow D0790, Suco-Gelb L1250, Suco-Yellow D1355, Hostaperm® Pink E, Fanal Pink D4830, Cinquasia Magenta, Lithol Scarlet D3700, Toluidine Red, Scarlet for Thermoplast NSD PS PA, E.D. Toluidine Red, Lithol Rubine Toner, Lithol Scarlet 4440, Bon Red C, Royal Brilliant Red RD-8192, Oracet Pink RF, Palhogen® Red 3871K, Paliogen® Red 3340, and Lithol Fast Scarlet L4300. These are available from sources such as Hoechst Celanese Corporation, Paul Uhlich, BASF, American Hoechst, Ciba-Geigy, Aldrich, DuPont, Ugine Kuhlman of Canada, Dominion Color Company, Magruder, and Matheson, Coleman, Bell.

The pigment can have a wide range of BET surface areas, as measured by nitrogen adsorption. Preferably, the pigment has a surface area of from about 10 to 600 m$^2$/g. More preferably, the surface area is from about 20 to 250 m$^2$/g, and most preferably from about 20 to 100 m$^2$/g. If the preferred surface area of the pigment is not readily available, it is well recognized by those skilled in the art that the pigment may be subject to conventional size communication or reduction techniques, such as ball or jet milling, to reduce the pigment to the desired particle size.

The pigment can also have a wide range of dibutylphthalate absorption (DBP) values, which is a measure of the structure or branching of the pigment. Preferably the DBP value of the pigment is from about 25 to 70 mL/100 g, more preferably from about 30 to 50 mL/100 g, and most preferably from about 30 to 40 mL/100 g. In addition, the pigment may have a wide range of primary particle sizes. It is preferred that the primary particle size is from about 10 to 100 nm, more preferably 15 to 60 nm. The preferred pigments approach an essentially overall spherical geometry. Pigments with other shapes, such as needles and plates, may also be used.

The modified pigment product of the present invention comprises a pigment having attached at least one polymeric group. The polymeric group can be any type of polymeric group capable of being attached to the pigment, such as, for example, a thermoplastic polymeric group or a thermosetting polymeric group. The polymeric group can be a random polymer, alternating polymer, graft polymer, block polymer, star-like polymer, and/or comb-like polymer. In addition, the polymeric group can be a homopolymer, copolymer, terpolymer, and/or a polymer containing any number of different repeating units. Examples of polymeric groups include, but are not limited to, polycarbonates, polyethers, polyesters, polyacrylates, polymethacrylates, polystyrenes, polyamines, and polyolefins. Preferably, the polymeric group comprises a phenylether or bisphenyl ether and a substituted propanediyl group. For example, the polymeric group may be a polymer prepared from epoxy bisphenol-A, oligomers of epoxy bisphenol-A, or epoxy novolac. Another preferred polymeric group comprises styrene and maleic anhydride, maleic acid, or salts or derivatives thereof. For example, the polymeric group may be a polymer of styrene and a maleic anhydride half ester. Also, the polymeric group can be attached to the pigment at multiple points along the polymer chain through proper choice of substituent groups on the repeating monomer units.

In one embodiment of the present invention, the modified pigment product comprises a pigment having attached at least one polymeric group, wherein the polymeric group comprises at least one photopolymerizable group and at least one ionic or ionizable group. As used herein, the term "photopolymerizable group" is defined as any organic functional group capable of forming polymeric materials upon exposure to radiation, such as ultraviolet, infrared, or electron beam radiation. This includes groups which are photoreactive (that is, they form reactive species such as radicals upon exposure to radiation), also sometimes referred to as photoinitiators, as well as groups which react with the reactive species formed from photoreactive groups. Examples include azo groups and ethylenically unsaturated groups. Preferred photopolymerizable groups comprise acrylate groups, methacrylate groups, vinyl groups, and styrenic groups. Most preferred are acrylate esters and methacrylate esters.

For this embodiment, the polymeric group further comprises at least one ionic or ionizable group. As used herein, an "ionic group" is either anionic or cationic and is associated with a counterion of the opposite charge, and an "ionizable group" is one that is capable of forming an ionic group in the medium of use.

The polymeric group may comprise at least one anionic or anionizable group. Anionic groups are negatively charged ionic groups that may be generated from groups having ionizable substituents that can form anions (anionizable groups), such as acidic substituents. They may also be the anion in the salts of ionizable substituents. Preferably, when the ionizable substituent forms an anion, the ionizable substituent has a pK$_a$ of less than 11. The anionic group could further be generated from a species having ionizable groups with a pK$_a$ of less than 11 and salts of ionizable substituents having a pK$_a$ of less than 11. The pK$_a$ of the ionizable substituent refers to the pK$_a$ of the ionizable substituent as a whole, not just the acidic substituent. More preferably, the $pK_a$ is less than 10 and most preferably less than 9.

Representative examples of anionic groups include —COO⁻, —SO₃⁻, —OSO₃⁻, —HPO₃⁻, —PO₃⁻², —OPO₃⁻², —R'S⁻, —R'O⁻, and representative examples of anionizable groups include —COOH, —SO₃H, —PO₃H₂, —R'SH, —R'OH, and —SO₂NHCOR', wherein R' represents a substituted or unsubstituted aryl and/or alkyl group. Preferably, the anionic or anionizable group comprises a carboxylic acid group, a sulfonic acid group, a phosphonic acid group, or salts thereof. Most preferred is a carboxylic acid group or salt thereof.

The polymeric group may comprise at least one cationic or cationizable group. Cationic groups are positively charged organic ionic groups that may be generated from ionizable substituents that can form cations (cationizable groups), such as amines. For example, alkyl or aryl amines may be protonated in acidic media to form ammonium groups —NR'₂H⁺, where R' represent an organic group such as a substituted or unsubstituted aryl and/or alkyl group. Preferably, the amine has a $pK_b$ of less than 5. Cationic groups may also be positively charged organic ionic groups. Examples include quaternary ammonium groups (—NR'₃⁺) and quaternary phosphonium groups (—PR'₃⁺). Here, R' represents hydrogen or an organic group such as a substituted or unsubstituted aryl and/or alkyl group. Preferably, the cationic or cationizable group comprises an amine group or a salt thereof.

In a second embodiment of the present invention, the modified pigment product comprises a pigment having attached at least one polymeric group, wherein the polymeric group has the formula —X-Sp-[PP]. X, which is directly attached to the pigment, represents an arylene or heteroarylene group or an alkylene group and is substituted with an Sp group. Sp represents a spacer group. The group PP represents a polymeric group comprising repeating monomer groups or multiple monomer groups or both. The polymeric group optionally comprises at least one photopolymerizable group, optionally at least one ionic or ionizable group, or optionally both. Preferably the polymeric group comprises at least one photopolymerizable group. More preferably, the polymeric group further comprises at least one ionic or ionizable group. The polymeric group can also be further substituted with additional groups. The total number of monomer repeating units that comprise the group PP is preferably not greater than about 500 monomer repeating units, and more preferably is not greater than about 100 monomer repeating units.

The group PP can be any type of polymeric group, as described above, such as, for example, a homopolymer, copolymer, terpolymer, and/or a polymer containing any number of different repeating units. Further, the group PP can be a random polymer, alternating polymer, graft polymer, block polymer, star-like polymer, and/or comb-like polymer. Preferred examples of the group PP are those described above.

The group Sp represents a spacer group which, as used herein, is a link between two groups. The group Sp can be a bond or a chemical group. Examples of chemical groups include, but are not limited to, —CO₂—, —O₂C—, —CO—, —OSO₂—, —SO₃—, —SO₂—, —SO₂C₂H₄O—, —SO₂C₂H₄S—, —SO₂C₂H₄NR—, —O—, —S—, —NR—, —NRCO—, —CONR—, —NRCO₂—, —O₂CNR—, —NRCONR—, —NRCOCH(CH₂CO₂R)—, —NRCOCH₂CH(CO₂R)—, —N(COR)(CO)—, —OOC-Alk-COO—, —OOC-Alk-CONR—, —OOC-Alk-CONR (CH₂—CH₂)ₓNR—(CH₂—CH₂)—SO₂—, —OOC-Alk-COO(CH₂—CH₂)ₓO—(CH₂—CH₂)—SO₂—, —OOC-Alk-COO(AOX)ₓ—(CH₂—CH₂)—SO₂—, —OOC-Alk-CONR(AOX)ₓ-Alk-NR—(CH₂—CH₂)—SO₂—, —O— (CH₂—CH₂)—SO₂—, imide groups, arylene groups, alkylene groups and the like. R, which can be the same or different, represents hydrogen or an organic group such as a substituted or unsubstituted aryl or alkyl group, Alk represents a saturated or unsaturated cyclic or linear alkylene group such as a cyclohexanediyl group, AOX represents an alkylene oxide group of from about 1 to about 12 carbons, and x is an integer between 1 and 500.

The group X represents an arylene or heteroarylene group or an alkylene group. X is directly attached to the pigment and is further substituted with an Sp group. The aromatic group can be further substituted with any group, such as one or more alkyl groups or aryl groups. Preferably, the arylene group is phenylene, naphthylene, or biphenylene, and the heteroarylene group. When X represents an alkylene group, examples include, but are not limited to, substituted or unsubstituted alkylene groups which may be branched or unbranched. The alkylene group can be substituted with one or more groups, such as aromatic groups. Examples include, but are not limited to, $C_1$–$C_{12}$ groups like methylene, ethylene, propylene, or butylene, groups. Preferably, X is an arylene group.

The group X may be substituted with one or more functional groups. Examples of functional groups include, but are not limited to, R", OR", COR", COOR", OCOR", carboxylates, halogens, CN, NR"₂, SO₃H, sulfonates, sulfates, NR"(COR"), CONR"₂, NO₂, PO₃H₂, phosphonates, phosphates, N=NR", SOR", NSO₂R", wherein R" which can be the same or different, is independently hydrogen, branched or unbranched $C_1$–$C_{20}$ substituted or unsubstituted, saturated or unsaturated hydrocarbons, e.g., alkyl, alkenyl, alkynyl, substituted or unsubstituted aryl, substituted or unsubstituted heteroaryl, substituted or unsubstituted alkaryl, or substituted or unsubstituted aralkyl.

As shown by the structure above, the group PP is attached to the pigment through the spacer group Sp. In addition, the group PP can also be attached to the pigment at multiple points along the polymer chain through proper choice of substituent groups on the repeating monomer units. These substituents may also comprise spacer groups or —X-Sp- groups as described above. Thus, these groups can be attached to the pigment at either end or at points along the backbone. Further, these groups can be any type of polymeric group, such as a random polymer, alternating polymer, graft polymer, block polymer, star-like polymer, and/or comb-like polymer.

In one preferred embodiment, the group PP represents a polymer having the formula [T—Y—(Q—Y)ₙ—T], wherein n represent the number of repeating units Q—Y in the polymer and is an integer from 1 to 20. Q comprises a bisphenyl ether group such as, for example, —O—C₆H₄—C(CH₃)₂—C₆H₄—O—, —O—C₆H₄—CH₂—C₆H₄—O—, or —O—C₆H₄-fluorenyl-C₆H₄—O—. Y comprises a substituted propanediyl group and includes groups having the formula —CH₂—CH(Z)—CH₂—, wherein Z is —OH or —OOC-Alk-COOH, or salt thereof. Alk represents a saturated or unsaturated cyclic or linear alkyl group, such as a cyclohexanediyl group. Z may also be a bond to the spacer group, Sp. In this case, preferred space groups Sp include —OOC-Alk-COO—, —OOC-Alk-CONR—, —OOC-Alk-CONR(CH₂—CH₂)ₓNR—(CH₂—CH₂)—SO₂—, —OOC-Alk-COO(CH₂—CH₂)ₓO—(CH₂—CH₂)—SO₂—, —OOC-Alk-COO(AOX)ₓ—(CH₂—CH₂)—SO₂—, —OOC-Alk-CONR(AOX)$_x$—Alk-NR—(CH$_2$—CH$_2$)—SO$_2$—, or —O—(CH$_2$—CH$_2$)—SO$_2$—, wherein R, which can be the same or different, is hydrogen or a substituted or unsubstituted aryl or alkyl group, AOX represents an alkylene oxide group of from about 1 to about 12 carbons, and x is an integer between 1 and 500. T represents a terminating group and includes, for example, alkyl ester groups such as acetate and propionate. Preferably, T further comprises the photopolymerizable group and may be a group such as CH$_2$=CH—COO— or CH$_2$=C(CH$_3$)—COO—.

In a second preferred embodiment, the group PP represents a polymer having the formula [A—(CR$_2$B)$_n$—CR$_2$A], wherein n represent the number of repeating units B in the polymer and is an integer from 1 to 20. R, which can be the same or different, is hydrogen or a substituted or unsubstituted aryl or alkyl group. A and B comprise a phenyl ether group and a substituted propanediyl group, and may further comprise the photopolymerizable group. Examples of group A include groups having the formula:

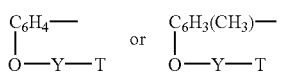

Examples of group B include groups having the formula:

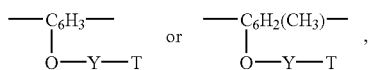

Y and T are as described above.

The modified pigments of the present invention are modified using methods known to those skilled in the art such that organic groups are attached to the pigment. For example, the modified pigments used in the dispersions of the present invention can be prepared using the methods described in U.S. Pat. Nos. 5,851,280, 5,698,016, 5,922,118, and 5,837,045, and PCT Publication Nos. WO 99/51690 and WO 00/22051, the descriptions of which are fully incorporated herein by reference. This provides a more stable attachment of the groups on the pigment compared to adsorbed groups, such as polymers, surfactants, and the like.

The modified pigments may also comprise a pigment having attached at least one organic group, wherein the organic group comprises the reaction product of a pigment having attached a first chemical group with a second chemical group to form a pigment having attached a third organic group. For this, the modified pigments can be prepared using methods known to those skilled in the art. For example, the modified pigments may be prepared using the method described in PCT Publication No. WO 01/51566, which is incorporated in its entirety herein by reference. Thus, for example, the organic group may comprise the reaction product of at least one electrophile, such as a (2-sulfatoethyl)-sulphone group or a benozoic acid group, and at least one nucleophilic polymer, such as a polyamine or an amine derivative of an epoxy bisphenol-A polymer. Further reactions on these attached organic groups, such as acylation reactions, are also possible. Other examples are also disclosed in the above cited reference.

The amount of the attached polymeric groups can be varied in order to attain the desired performance attributes. Preferably, the total amount of attached polymeric groups is from about 0.001 to about 10.0 micromoles of polymeric group/m$^2$ surface area of pigment, as measured by nitrogen adsorption (BET method). More preferably, the amount of attached polymeric groups is between from about 0.01 to about 5.0 micromoles/m$^2$ and most preferably is between from about 0.05 to 3.0 micromoles/m$^2$. In addition, the modified pigments may further comprise additional attached organic groups. This can result in further improved properties. In one preferred embodiment, the modified pigment comprises a polymeric group and an ionic group, ionizable group, or mixture of ionic and ionizable groups. Examples include those described above for attached polymeric groups comprising ionic or ionizable groups. Preferably the ionic or ionizable group comprises a carboxylic acid, a sulfonic acid group, or salts thereof.

The modified pigments may be purified by washing, such as by filtration, centrifugation, or a combination of the two methods, to remove unreacted raw materials, byproduct salts and other reaction impurities. The products may also be isolated, for example, by evaporation or it may be recovered by filtration and drying using known techniques to those skilled in the art.

The modified pigment products of the present invention can be also be combined with a liquid vehicle to form a dispersion. The type of liquid will depend on the type and amount of polymeric groups attached to the modified pigment. While both aqueous and non-aqueous liquid vehicles can be used, preferably the liquid vehicle is a non-aqueous vehicle. Examples include non-aqueous vehicles comprising ethylcellosolve, ethylcellosolve acetate, butylcellosolve, butylcellosolve acetate, ethylcarbitol, ethylcarbitol acetate, diethyleneglycol, cyclohexanone, propyleneglycol monomethylether, propyleneglycol monomethylether acetate, lactate esters, and mixtures thereof. Aqueous solvents may also be added, including, for example, water and water soluble alcohols.

The modified pigment products may be formed into a dispersion using any method known to those skilled in the art, including, for example, using high shear mixing. The amount of modified pigment can be between about 1% and 60% based on the total weight of dispersion, and is preferably between about 5% to 30% by weight. The dispersions can be formed with a minimum of additional components (additives and/or cosolvents) and processing steps. However, additives such as surfactants and cosolvents may also be included. For example, a photosensitive resin, such as epoxy bisphenol-A or epoxy novolak, can be added.

The modified pigments formed into a dispersion may also be further purified or classified to remove impurities and other undesirable free species which can co-exist in the dispersion as a result of the manufacturing process. For example, the dispersion can be purified to remove any undesired free species, such as unreacted treating agent. Known techniques of ultrafiltration/diafiltration using a membrane or ion exchange may be used to purify the dispersion and remove a substantial amount of free ionic and unwanted species. An optional exchange of counterions step may also occur in the purification process whereby the counterions that may form a part of the modified pigment are exchanged or substituted with alternative counterions (including, e.g., amphiphilic ions) utilizing known ion exchange techniques such as ultrafiltration, reverse osmosis, ion exchange columns and the like. Particular examples of counterions that can be exchanged include, but are not limited to, Na$^+$, K$^+$, Li$^+$, NH$_4^+$, Ca$^{2+}$, Mg$^{2+}$, Cl$^-$, NO$_3^-$, NO$_2^-$, acetate, and Br$^-$.

The present invention further relates to a black matrix. As described above, a black matrix is formed by applying a photosensitive layer onto a substrate, irradiating the photosensitive layer imagewise, and developing and drying the coating. For the black matrixes of the present invention, the photosensitive layer comprises a modified black pigment product comprising a black pigment having attached at least one polymeric group. Preferably, the black pigment is a carbon product, and most preferably is carbon black. The carbon black can have a wide range of surface area, structure, and primary particle size, as described above, but preferably has a DBP value of from about 25 to 70 mL/100 g.

The polymeric group may be any of the polymeric groups described above. Thus, the polymeric group can comprise at least one photopolymerizable group and at least one ionic or ionizable group. For example, the polymeric group may be a group represented by the formula —X-Sp-[PP], where X, Sp, and PP are as defined above.

The choice of ionic or ionizable group will depend on the method used for developing the black matrix. For example, if an alkaline developer is used, the ionic or ionizable group will preferably be an anionic or anionizable group. If an acidic developer is used, a cationic or cationizable group is preferred.

The black matrix of the present invention may further comprise a photosensitive resin, such as, for example, resins prepared from an epoxy bisphenol-A or an epoxy novolac. Other photosensitive resins will be known to those skilled in the art.

The volume resistivity and optical density are important properties for a black matrix material. Volume resistivity is a measure of the ability of a material to prevent the conduction of electricity and can be measured using techniques known in the art, for example, as defined in ASTM procedure D257-93. Optical density (OD) is a measure of the opacity of a material and is typically measured using a densitometer. OD is dependent on several factors, including the thickness of the film. The black matrixes of the present invention preferably have a volume resistivity of greater than or equal to $10^{13}$ ohm-cm. More preferably, the black matrixes of the present invention also have an optical density of greater than about 3 at a film thickness of 1 micron.

The amount of the attached polymeric groups of the modified pigments in the black matrixes of the present invention can be varied in order to attain the desired overall performance attributes. The total amount of attached polymeric groups is as described above and can range from about 0.001 to about 10.0 micromoles of polymeric group/$m^2$ surface area of pigment, as measured by nitrogen adsorption (BET method), more preferably from about 0.01 to 5.0 micromoles/$m^2$, and most preferably from about 0.05 to 3.0 micromoles/$m^2$.

The photosensitive layer of the black matrixes of the present invention comprise an amount of modified black pigment product effective to attain the desired overall properties. The amount of modified black pigment will depend on the type of pigment and the amount of attached polymeric groups. Preferably, the amount of modified black pigment in the photosensitive layer is between 10% and 70%, more preferably 20% to 60%, and most preferably, 30% to 50%. It has been found that a lower level of these modified black pigments are needed to produce the desired overall properties compared to conventional black pigments.

While not wishing to be bound by theory, it is believed that the attached polymeric groups of the modified pigment products of the present invention separate the pigment particles and thereby reduce the conductivity of a black matrix that incorporates the pigment particles. In addition, it is believed that the modified pigments comprising a pigment having attached at least one polymeric group having the formula —X-Sp-[PP] have a uniform distribution of attached groups. This leads to a more effective separation of particles and results in a very high volume resistivity in a black matrix. It is believed that, in general, higher densities of attached groups lead to higher volume resistivities. The attached polymeric groups also allow the modified pigments to be dispersed well within the photosensitive layer, thereby resulting in high OD, even at relatively low loadings. The presence of a photopolymerizable group enables the modified pigment to react upon irradiation, thus becoming crosslinked within the photosensitive layer. The ionic or ionizable group enables any non-photopolymerized material to be developable.

The present invention further relates to a resin composition comprising: a) a photosensitive resin and b) a modified pigment product, wherein the resin composition has been cured by irradiation. The resin composition may further comprise a photoinitiator. The modified pigment product is as described above and comprises a pigment having attached at least one polymeric group, wherein the polymeric group comprises at least one photopolymerizable group and at least one ionic or ionizable group. For example, the polymeric group may have the formula —X-Sp-[PP], wherein X, Sp, and PP are as described above. Preferably the pigment is carbon black having a dibutylphthalate adsorption (DBP) of from about 25 to 70 mL/100 g. The photosensitive resin can be any of those known to one skilled in the art, such as, for example, an epoxy bisphenol-A resin or an epoxy novolac resin. The resin composition may be cured by any source of radiation such as, for example, infrared or ultraviolet radiation.

The present invention will be further clarified by the following examples which are intended to be only exemplary in nature.

EXAMPLES

Example 1

Polymer Preparation

Acrylic acid (4.8 g) was slowly added at 66° C. to a stirred solution of 30 g of bisphenol-A epoxy resin (EPON 1001F, available from Resolution Performance Products) in 30 g of THF. Tetraethyl ammonium bromide (0.2 g) was added as a catalyst and methoxyhydroquinone (0.1 g) as an antioxidant. The reaction was monitored by acid number measurements. After 30 hours of reaction in refluxing THF, hexahydrophthalic anhydride (10.5 g) was added to the reaction mixture and stirred for an additional 2 hr at the same temperature. The resulting carboxy acrylated polymer solution in THF was allowed to cool to room temperature and used without further isolation.

Example 2

Modification of the Polymer 1,4-phenylene diamine (2.95 g) was added to the polymer solution of Example 1 along with 250 mL of THF, and after dissolution, 5.6 g of dicyclohexylcarbodiimide (DCC) was added. The reaction mixture was stirred for 2 hr at room temperature and purified by filtration to remove the precipitated urea.

Example 3

Preparation of a Modified Pigment Product

Modified polymer solution of Example 2 and 30 g of carbon black were mixed in a rotor stator. The carbon black had a surface area of 50 $m^2/g$ and DBP of 46 mL/100 g. Methanesulfonic acid (0.96 g) was added. A solution of 0.69 g of $NaNO_2$ in 10 g of water was added drop-wise, and mixing was continued for an additional 3 hr. The resulting dispersion was purified by diafiltration using first acetone/THF (20/80) solution followed by acetone and finally propylene glycol methoxy ether acetate (PGMEA). The resulting dispersion was filtered sequentially through a series of filters (20 micron, 5 micron, 1 micron, and 0.5 micron).

Example 4

Preparation of a Polymer Film

The modified carbon black dispersion of Example 3 could be mixed with a carboxylated epoxy cresol novolac polymer solution in butoxy ethyl acetate (65% solids, Actilane 340 manufactured by Akros Chemicals). The resulting formulation could then be coated onto a stainless steel panel with a 1.5 mil bird bar and drying for 45 min in an oven at 90° C. The resulting dried film (40% modified carbon black and 60% polymer) would be expected to have a thickness of about 7 microns. The volume resistivity of the film could be measured according ASTM procedure D257-93. The resulting dried film would be expected to have good overall properties.

Example 5

Modification of the Polymer

Actilane 340 (31.2 g, 65% solution in butoxy ethyl acetate, a carboxylated epoxy cresol novolac polymer manufactured by Akros Chemicals) was dissolved in 300 mL of dry THF. 1,4-phenylene diamine (PDA, 1.68 g) was added to the polymer solution. After dissolution of PDA, dicyclohexylcarbodiimide (DCC, 3.22 g) was added. The reaction mixture was stirred for 24 hours at room temperature under argon and purified by filtration to remove the precipitated urea.

Example 6

Modification of the Polymer

Actilane 340 (150 g, 65% solution in butoxy ethyl acetate, a carboxylated epoxy cresol novolac polymer manufactured by Akros Chemicals) was dissolved in 700 mL of dry N-methyl pyrrolidone (NMP). 1,4-phenylene diamine (PDA, 6.55 g) was added to the polymer solution. After dissolution of PDA, dicyclohexylcarbodiimide (DCC, 60 ml of 1M solution in methylene chloride) was added drop-wise. The reaction mixture was stirred for 19 hours at room temperature under argon and purified by filtration to remove the precipitated urea.

Example 7

Modification of the Polymer

Sarbox SB404 (30 g, 55% solution in PGMEA, a polymer of styrene and maleic acid half ester with hydroxyethyl acrylate manufactured by Sartomer) was dissolved in 150 mL of NMP. 1,4-phenylene diamine (PDA, 1.08 g) was added to a polymer solution. After dissolution of PDA, dicyclohexylcarbodiimide (DCC, 2.78 g) was added. The reaction mixture was stirred for 24 hours at room temperature under argon and purified by filtration to remove the precipitated urea.

Example 8

Preparation of a Modified Pigment Product

Modified polymer solution of Example 5 and 30 g of carbon black were mixed in a rotor stator and brought to a temperature of 40° C. The carbon black had a surface area of 50 $m^2/g$ and DBP of 46 ml/100 g. Methanesulfonic acid (0.95 g) was added. A solution of 0.75 g of $NaNO_2$ in 10 g of water was added drop-wise, and mixing was continued for an additional 3 hours at 40° C. The resulting dispersion was purified by diafiltration using first water/THF (10/90) mixture followed by THF and finally PGMEA. The resulting dispersion comprised a modified pigment product having a polymer attachment level of 26% as determined by TGA and had a solids content of 20.7%.

Example 9

Preparation of a Modified Pigment Product

Carbon black (150 g) with a surface area of 50 $m^2/g$ and DBP of 46 ml/100 g, 1400 mL of NMP, and 100 mL of water were mixed in a rotor stator at 55° C. Sulfanilic acid (5.7 g) was added and stirred for 10 min. $NaNO_2$ (4.5 g) was dissolved in 10 mL of water and slowly added. The reaction mixture was then mixed with a rotor stator for 2 hours.

Modified polymer solution from Example 6 was added to this reaction mixture in the rotor stator. Methanesulfonic acid (10.8 g) was also added, and the temperature was increased to 55° C. Finally, a solution of 4.5 g of $NaNO_2$ in 10 g of water was slowly added. The reaction mixture was mixed with rotor stator for an additional 2 hours. The resulting dispersion was purified by diafiltration using first water/NMP (10/90) mixture followed by NMP and finally PGMEA. The resulting dispersion comprised a modified pigment product having a polymer attachment level of 34.8% as determined by TGA and had a solids content of 17.3%.

Example 10

Preparation of a Modified Pigment Product

Modified polymer solution of Example 7 and 30 g of carbon black were mixed in a rotor stator and brought to a temperature of 55° C. The carbon black had a surface area of 50 $m^2/g$ and DBP of 46 mL/100 g. Methanesulfonic acid (0.95 g) was added. A solution of 0.75 g of $NaNO_2$ in 10 g of water was added drop-wise, and mixing was continued for additional 3 hours at 55° C. The resulting dispersion was purified by diafiltration using first water/NMP (10/90) mixture followed by NMP and finally PGMEA. The resulting dispersion comprised a modified pigment product having a polymer attachment level of 29.8% as determined by TGA and had a solids content of 18.5%.

Example 11

Preparation of a Modified Pigment Product

Carbon black (150 g) with a surface area of 100 $m^2/g$ and DBP of 31 ml/100 g, 1400 mL of NMP, and 100 mL of water were mixed in a rotor stator at 55° C. Sulfanilic acid (5.7 g) was added and stirred for 10 min. $NaNO_2$ (4.5 g) was dissolved in 10 mL of water and slowly added. The reaction mixture was then mixed with a rotor stator for 2 hours.

Modified polymer solution from Example 6 was added to this reaction mixture in the rotor stator. Methanesulfonic acid (10.8 g) was also added, and the temperature was increased to 55° C. Finally, a solution of 4.5 g of $NaNO_2$ in 10 g of water was slowly added. The reaction mixture was mixed with rotor stator for an additional 2 hours. The resulting dispersion was purified by diafiltration using first water/NMP (10/90) mixture followed by NMP and finally PGMEA. The resulting dispersion comprised a modified pigment product having a polymer attachment level of 17.6% as determined by TGA and had a solids content of 16.9%.

Example 12

Preparation of a Polymer Film

The modified carbon black dispersions of Examples 8, 9, 10, and 11 were mixed with Actilane 340 (65% solids, manufactured by Akros Chemicals) and PGMEA to have an approximate solids content of 20%.

For volume resistivity measurements, the resulting formulations were coated onto a steel Q-panel with a 1 micron doctor's blade and dried for 45 min in an oven at 90° C. The resulting dried films (40% modified carbon black and 60% polymer, 45% modified carbon black and 55% polymer, and 50% modified carbon black and 50% polymer) had a thickness of about 5–8 microns (as measured on a KLA Tencor Alpha Step 500 Surface Profilometer). The volume resistivity of the films was measured using a Keithley Model 65 instrument equipped with an ETS 803B resistivity probe using alternating polarity methods. The applied voltage for most measurements was +/−5V.

For optical density (OD) measurements, the formulations were spin coated on glass slides and dried for 45 min in an oven at 90° C. The resulting dried films (40% modified carbon black and 60% polymer, 45% modified carbon black and 55% polymer, and 50% modified carbon black and 50% polymer) had a thickness of about 0.6–1.7 microns (as measured on a KLA Tencor Alpha Step 500 Surface Profilometer). OD was measured using an X-Rite 361T Transmission Densitometer.

The resulting dried films from the dispersion of Example 8 had volume resistivities of $1.2\times10^{14}$ ohm-cm (40% modified carbon black) and $2\times10^{14}$ ohm-cm (50% modified carbon black). The dried films from the dispersion of Example 9 had volume resistivities of $6.5\times10^{13}$ ohm-cm (40% modified carbon black), $5.4\times10^{13}$ ohm-cm (45% modified carbon black) and $7\times10^{13}$ ohm-cm (50% modified carbon black). The dried films from the dispersion of Example 10 had volume resistivities of $3.5\times10^{13}$ ohm-cm (40% modified carbon black). The dried films from the dispersion of Example 11 had volume resistivities of $7\times10^{13}$ ohm-cm (40% modified carbon black) and $3\times10^{13}$ ohm-cm (45% modified carbon black). Optical densities were generally found to be about 3.0/µm, particularly for films containing 50% modified carbon black. Therefore, a good combination of properties, in particular electrical and optical properties, were found for films prepared using the modified pigment products of the present invention.

The foregoing description of preferred embodiments of the present invention has been presented for the purposes of illustration and description. It is not intended to be exhaustive or to limit the invention to the precise form disclosed. Modifications and variations are possible in light of the above teachings, or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A black matrix formed by applying a photosensitive layer onto a substrate, irradiating the photosensitive layer imagewise, and developing and drying the coating, wherein the photosensitive layer comprises a modified black pigment product comprising a black pigment having attached at least one polymeric group, wherein the polymeric group is a homopolymer, random polymer, or alternating polymer wherein the polymeric group comprises at least one photopolymerizable group and at least one ionic or ionizable group.

2. The black matrix of claim 1, further comprising a photosenstive resin.

3. The black matrix of claim 1, wherein the black matrix has a volume resistivity of greater than or equal to $10^{13}$ ohm-cm.

4. The black matrix of claim 3, wherein the black matrix has an optical density of about 3 at a thickness of about 1 micron.

5. The black matrix of claim 1, wherein the black pigment is a carbon product.

6. The black matrix of claim 5, wherein the carbon product is a carbon black having a dibutylphthalate absorption of from about 25 to 70 mL/100 g.

7. The black matrix of claim 1, wherein the polymeric group comprises a phenyl ether group and a substituted propanediyl group.

8. The black matrix of claim 1, wherein the polymeric group comprises a polymer prepared from epoxy bisphenol-A, oligomers of epoxy bisphenol-A, or epoxy novolac.

9. A black matrix formed by applying a photosensitive layer onto a substrate, irradiating the photosensitive layer imagewise, and developing and drying the coating, wherein the photosensitive layer comprises a modified black pigment product comprising a black pigment having attached at least one polymeric group having the formula —X-Sp-[PP], wherein X, which is directly attached to the pigment, represents an arylene, a heteroarylene, or an alkylene group, Sp represents a spacer group, and PP represents a polymer comprising at least one ionic or ionizable group and optionally comprising at least one photopolymerizable group.

10. The black matrix of claim 9, further comprising a photosensitive resin.

11. The black matrix of claim 9, wherein the black matrix has a volume resistivity of greater than or equal to $10^{13}$ ohm-cm.

12. The black matrix of claim 11, wherein the black matrix has an optical density of about 3 at a thickness of about 1 micron.

13. The black matrix of claim 9, wherein the black pigment is a carbon product.

14. The black matrix of claim 13, wherein the carbon product is a carbon black having a dibutylphthalate absorption of from about 25 to 70 mL/100 g.

15. The black matrix of claim 9, wherein the polymeric group comprises a phenyl ether group and a substituted propanediyl group.

16. The black matrix of claim 9, wherein PP comprises a polymer prepared from epoxy bisphenol-A, oligomers of epoxy bisphenol-A, or epoxy novolac.

17. The black matrix of claim 9, wherein PP represents a polymer having the formula [T-Y—(Q-Y)$_n$-T], wherein Q comprises a bisphenyl ether group, Y comprises a substituted propanediyl group, T comprises a terminating group, and n is an integer from 1 to 20.

18. The black matrix of claim 17, wherein T comprises the photopolymerizable group.

19. The black matrix of claim 17, wherein T comprises an alkyl ester.

20. The black matrix of claim 17, wherein: Q is —O—C$_6$H$_4$—C(CH$_3$)$_2$—C$_6$H$_4$—O—, —O—C$_6$H$_4$—CH$_2$—C$_6$H$_4$—O—, or —O—C$_6$H$_4$-fluorenyl-C$_6$H$_4$—O—; Y is —CH$_2$—CH(Z)—CH$_2$—, wherein Z is —OH, —OOC-Alk-COOH, or salt thereof, or a bond to Sp, and Alk represents a saturated or unsaturated cyclic or linear alkyl group; and T is CH$_2$=CH—COO— or CH$_2$=C(CH$_3$)—COO—.

21. The black matrix of claim 20, wherein Sp is —OOC-Alk-COO—, —OOC-Alk-CONR—, —OOC-Alk-CONR(CH$_2$—CH$_2$)$_x$NR—(CH$_2$—CH$_2$)—SO$_2$—, —OOC-Alk-COO(CH$_2$—CH$_2$)$_x$O—(CH$_2$—CH$_2$)—SO$_2$—, —OOC-Alk-COO(AOX)$_x$—(CH$_2$—CH$_2$)—SO$_2$—, —OOC-Alk-CONR(AOX)$_x$-Alk-NR—(CH$_2$—CH$_2$)—SO$_2$—, or —O—(CH$_2$—CH$_2$)—SO$_2$—, wherein R, which can be the same or different, is hydrogen or a substituted or unsubstituted aryl or alkyl group, AOX represents an alkylene oxide group of from about 1 to about 12 carbons, and x is an integer between 1 and 500.

22. The black matrix of claim 9, wherein PP represents a polymer having the formula [A-(CR$_2$B)$_n$—CR$_2$A], wherein A and B comprise a phenyl ether group and a substituted propanediyl group, R, which can be the same or different, is hydrogen or a substituted or unsubstituted aryl or alkyl group and n is an integer from 1 to 20.

23. The black matrix of claim 22, wherein A and B further comprise the photopolymerizable group.

24. The black matrix of claim 22, wherein:

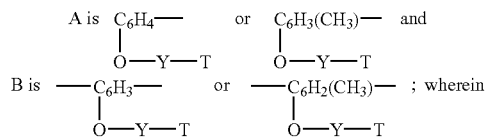

Y is —CH$_2$—CH(Z)—CH$_2$—, wherein Z is —OH, —OOC-Alk-COOH or salt thereof, or a bond to Sp, and Alk represents a saturated or unsaturated cyclic or linear alkyl group; and T is CH$_2$=CH—COO— or CH$_2$=C(CH$_3$)—COO—.

25. The black matrix of claim 24, wherein T comprises an alkyl ester.

26. The black matrix of claim 24, wherein Sp is —OOC-Alk-COO—, —OOC-Alk-CONR—, —OOC-Alk-CONR(CH$_2$—CH$_2$)$_x$NR—(CH$_2$—CH$_2$)—SO$_2$, —OOC-Alk-COO(CH$_2$—CH$_2$)$_x$O—(CH$_2$—CH$_2$)—SO$_2$—, —OOC-Alk-COO(AOX)$_x$—(CH$_2$—CH$_2$)—SO$_2$—, —OOC-Alk-CONR(AOX)$_x$-Alk-NR—(CH$_2$—CH$_2$)—SO$_2$—, or —O—(CH$_2$—CH$_2$)—SO$_2$—, wherein R, which can be the same or different, is hydrogen or a substituted or unsubstituted aryl or alkyl group, AOX represents an alkylene oxide group of from about 1 to about 12 carbons, and x is an integer between 1 and 500.

27. The black matrix of claim 9, wherein -Sp- is is —OOC-Alk-COO—, —OOC-Alk-CONR—, —OOC-Alk-CONR(CH$_2$—CH$_2$)$_x$NR—(CH$_2$—CH$_2$)—SO$_2$—, —OOC-Alk-COO(CH$_2$—CH$_2$)$_x$O—(CH$_2$—CH$_2$)—SO$_2$—, —OOC-Alk-COO(AOX)$_x$—(CH$_2$—CH$_2$)—SO$_2$—, —OOC-Alk-CONR(AOX)$_x$-Alk-NR—(CH$_2$—CH$_2$)—SO$_2$—, or —O—(CH$_2$—CH$_2$)—SO$_2$—, wherein R, which can be the same or different, is hydrogen or a substituted or unsubstituted aryl or alkyl group, AOX represents an alkylene oxide group of from about 1 to about 12 carbons, and x is an integer between 1 and 500.

28. A black matrix formed by applying a photosensitive layer onto a substrate, irradiating the photosensitive layer imagewise, and developing and drying the coating, wherein the photosensitive layer comprises a modified black pigment product comprising a black pigment having attached at least one polymeric group, wherein the polymeric group is a homopolymer, random polymer, or alternating polymer and has at least one ionic or ionizable group, and, wherein the black pigment is carbon black having a dibutylphthalate absorption (DBP) of from about 25 to 70 mL/100 g.

29. The black matrix of claim 28, further comprising a photosensitive resin.

30. The black matrix of claim 28, wherein the black matrix has a volume resistivity of greater than or equal to 10$^3$ ohm-cm.

31. The black matrix of claim 30, wherein the black matrix has an optical density of about 3 at a thickness of about 1 micron.

32. A resin composition comprising: a) a photosensitive resin and b) a modified pigment product comprising a pigment having attached at least one polymeric group, wherein the polymeric group is a homopolymer, random polymer, or alternating polymer and wherein the polymeric group comprises at least one photopolymerizable group and at least one ionic or ionizable group, wherein the resin composition has been cured by irradiation.

33. A resin composition comprising: a) a photosensitive resin and b) a modified pigment product comprising a pigment having attached at least one polymeric group having the formula —X-Sp-[PP], wherein X, which is directly attached to the pigment, represents an arylene, a heteroarylene, or an alkylene group, Sp represents a spacer group, and PP represents a polymer comprising at least one photopolymerizable group and at least one ionic or ionizable group, wherein the resin composition has been cured by irradiation.

34. The black matrix of claim 33, wherein -Sp- is is —OOC-Alk-COO—, —OOC-Alk-CONR—, —OOC-Alk-CONR(CH$_2$—CH$_2$)$_x$NR—(CH$_2$—CH$_2$)—SO$_2$—, —OOC-Alk-COO(CH$_2$—CH$_2$)$_x$O—(CH$_2$—CH$_2$)—SO$_2$—, —OOC-Alk-COO(AOX)$_x$—(CH$_2$—CH$_2$)—SO$_2$—, —OOC-Alk-CONR(AOX)$_x$-Alk- NR—(CH$_2$—CH$_2$)—SO$_2$—, or —O—(CH$_2$—CH$_2$)—SO$_2$—, wherein R, which can be the same or different, is hydrogen or a substituted or unsubstituted aryl or alkyl group, AOX represents an alkylene oxide group of from about 1 to about 12 carbons, and x is an integer between 1 and 500.

35. A resin composition comprising: a) a photosensitive resin and b) a modified pigment product comprising a pigment having attached at least one polymeric group, wherein the polymeric group is a homopolymer, random polymer, or alternating polymer and has at least one ionic or ionizable group, and wherein the pigment is carbon black having a dibutylphthalate adsorption (DBP) of from about 25 to 70 mL/100 g.

* * * * *